United States Patent
Suzuki et al.

(10) Patent No.: US 10,170,561 B1
(45) Date of Patent: Jan. 1, 2019

(54) DIAMOND SEMICONDUCTOR DEVICE

(71) Applicant: Kabushiki Kaisha Toshiba, Minato-ku (JP)

(72) Inventors: Mariko Suzuki, Yokohama (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/899,752

(22) Filed: Feb. 20, 2018

(30) Foreign Application Priority Data

Sep. 7, 2017 (JP) ................ 2017-172249

(51) Int. Cl.
| | |
|---|---|
| *H01L 29/06* | (2006.01) |
| *H01L 29/16* | (2006.01) |
| *H01L 29/423* | (2006.01) |
| *H01L 29/43* | (2006.01) |

(52) U.S. Cl.
CPC .......... *H01L 29/1602* (2013.01); *H01L 29/06* (2013.01); *H01L 29/42364* (2013.01); *H01L 29/43* (2013.01)

(58) Field of Classification Search
CPC ..... H01L 29/1602; H01L 29/43; H01L 29/06; H01L 29/42364
See application file for complete search history.

(56) References Cited

U.S. PATENT DOCUMENTS

| | | | |
|---|---|---|---|
| 9,478,619 B2 * | 10/2016 | Kato | ............ H01L 29/808 |
| 2011/0037076 A1 | 2/2011 | Kato et al. | |
| 2015/0060885 A1 | 3/2015 | Suzuki et al. | |
| 2015/0349060 A1 | 12/2015 | Suzuki et al. | |

FOREIGN PATENT DOCUMENTS

| | | |
|---|---|---|
| EP | 1 536 043 A1 | 6/2005 |
| JP | 2005-79196 | 3/2005 |
| JP | 2014-107454 | 6/2014 |

(Continued)

OTHER PUBLICATIONS

Hiromitsu Kato, et al. "Maskless Selective Growth Method for p-n Junction Applications on (001)-Oriented Diamond", Japanese Journal of Applied Physics 51, 2012, 8 pages.

(Continued)

*Primary Examiner* — David Vu
(74) *Attorney, Agent, or Firm* — Oblon, McClelland, Maier & Neustadt, L.L.P.

(57) ABSTRACT

In one embodiment, a diamond semiconductor device includes a first diamond semiconductor layer of a first conductivity type which has a main surface, a second diamond semiconductor layer of an i-type or a second conductivity type which is provided on the main surface of the first diamond semiconductor layer, and has a first side surface with a plane orientation of a {111} plane, a third diamond semiconductor layer of the first conductivity type which is provided on the first side surface, and a fourth diamond semiconductor layer of the second conductivity type which is provided on the main surface of the first diamond semiconductor layer and on a side surface of the second diamond semiconductor layer at a side opposite to a side of the third diamond semiconductor layer.

20 Claims, 2 Drawing Sheets

(56) References Cited

FOREIGN PATENT DOCUMENTS

JP          2015-50393          3/2015
WO     WO 2009/128301 A1    10/2009

OTHER PUBLICATIONS

Takayuki Iwasaki et al., Observation of Interface Defects in Diamond Lateral p-n-Junction Diodes and Their Effect on Reverse Leakage Current, pp. 3298-3302, IEEE Transactions on Electron Devices, vol. 64, No. 8, Aug. 2017.
Yuto Hoshino et al, Electrical Properties of Lateral p-n Junction Diodes Fabricated by Selective Growth of N+ Diamond, Phys. Status Solidi A 209, No. 9, 1761-1764 (2012)/ DOI 10.1002/pssa.201200053.

* cited by examiner

DIAMOND SEMICONDUCTOR DEVICE

CROSS-REFERENCE TO RELATED APPLICATION

This application is based upon and claims the benefit of priority from the prior Japanese Patent Application No. 2017-172249, filed on Sep. 7, 2017, the entire contents of which are incorporated herein by reference.

FIELD

Embodiments described herein relate generally to a diamond semiconductor device.

BACKGROUND

Diamond has excellent semiconductor characteristics, in addition to its excellent mechanical, chemical and thermal characteristics, and accordingly, diamond is attracting attention as a semiconductor device material. Particularly, diamond has a band gap of about 5.5 eV at a room temperature, and has high dielectric breakdown characteristics, and accordingly, diamond is expected as a power device. Further, diamond has robust crystalline characteristics, and thereby diamond is expected also as an environment resistant device to be used particularly under a severe environment such as at a high temperature and under radiation.

Recently, diamond power devices have actively been developed. For example, reports relating to a schottky barrier diode having a schottky junction, a device with a PIN structure, a device with a combination of a schottky junction and a PN junction, and so on have been made.

However, phosphorus (P) that is an n-type impurity is hardly introduced into a {100} plane of a diamond crystal. For the reason, it is difficult that n-type diamond on the {100} plane is made to have a low resistance, and in addition, it is difficult to control for making an n-type layer with a low concentration which is used as a drift layer or the like.

Hitherto, reports have been made for forming an n-type layer with a low resistance, but an n-type layer with a lot of defects has been formed, and thereby a good pn junction has not been formed. For the reason, it is expected that a diamond semiconductor device has a good pn junction, and has a high withstand voltage and a low resistance.

DETAILED DESCRIPTION

According to one embodiment, a diamond semiconductor device includes a first diamond semiconductor layer of a first conductivity type which has a main surface, a second diamond semiconductor layer of an i-type or a second conductivity type which is in directly contact with the main surface of the first diamond semiconductor layer, and has a first side surface with a plane orientation of a {111} plane, a third diamond semiconductor layer of the first conductivity type which is provided on the first side surface, and a fourth diamond semiconductor layer of the second conductivity type which is provided on the main surface of the first diamond semiconductor layer and on a side surface of the second diamond semiconductor layer at a side opposite to a side of the third diamond semiconductor layer.

Hereinafter, an embodiment of the present invention will be described with reference to the drawings. Ones with the same symbols show the similar ones. In addition, the drawings are schematic or conceptual, and accordingly, the relation between a thickness and a width of each portion, and a ratio coefficient of sizes between portions are not necessarily identical to those of the actual ones. In addition, even when the same portions are shown, the dimensions and the ratio coefficient thereof may be shown different depending on the drawings.

In the present specification, an i-type semiconductor means an intrinsic semiconductor. In other words, it means a semiconductor in which an n-type or a p-type dopant is not positively introduced. Regarding a dopant which is inevitably introduced into a semiconductor at the time of manufacturing the semiconductor, it is allowed.

Figure 1:
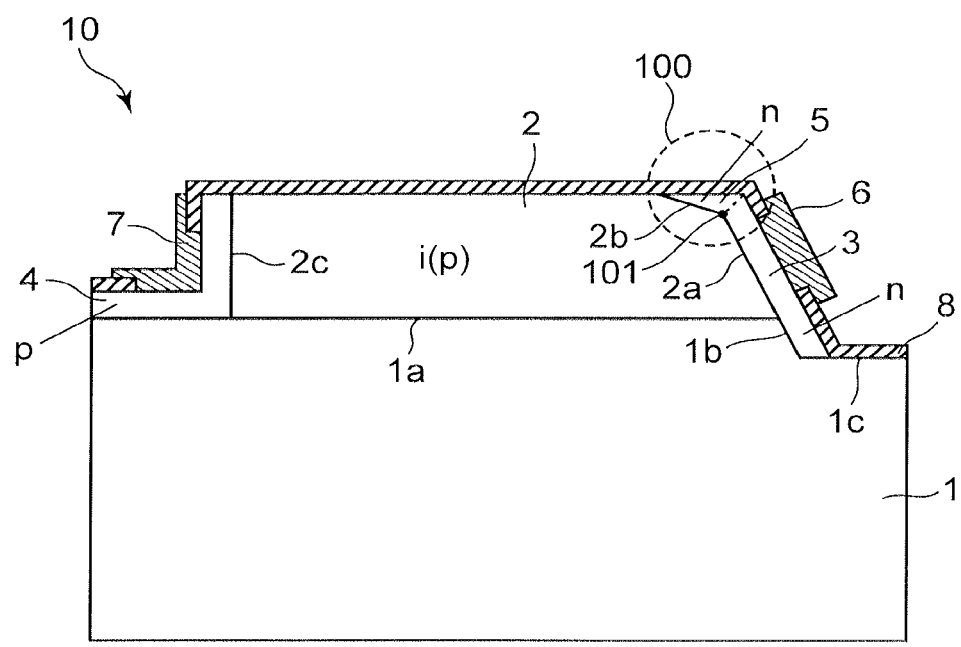
FIG. 1 is a schematic sectional view of a diamond semiconductor device of an embodiment.

FIG. 1 shows a schematic sectional view of a diamond semiconductor device 10.

The diamond semiconductor device 10 of the present embodiment is a PIN diode.

In the diamond semiconductor device 10 of the present embodiment, an n-type third diamond semiconductor layer 3 having an electric field relaxation effect is provided on a side surface of an i-type or a p-type second diamond semiconductor layer 2, and thereby a withstand voltage of the junction of the second diamond semiconductor layer 2 and the third diamond semiconductor layer 3 is improved.

In addition, in the present embodiment, a plane orientation of the side surface of the second diamond semiconductor layer 2 is set in a specified direction, and thereby it becomes easy to make an impurity concentration of the n-type third diamond semiconductor layer 3 to a desired concentration. Accordingly, the concentration of the n-type third diamond semiconductor layer 3 having an electric field relaxation effect can be controlled, and thereby the crystal quality of the third diamond semiconductor layer 3 is improved, and a PIN diode having a low resistance junction can be realized.

More preferably, a low concentration n-type fifth diamond semiconductor layer 5 is provided in the vicinity of a corner portion of the second diamond semiconductor layer 2, and thereby a width of a depletion layer in the fifth semiconductor layer 5 is increased, and accordingly it is possible to relax the electric field concentration to the corner portion of the second diamond semiconductor layer 2. Accordingly, a further electric field relaxation effect is obtained, and the withstand voltage of the junction is improved.

Hereinafter, the diamond semiconductor device 10 of the present embodiment will be described in more detail.

The diamond semiconductor device 10 is provided with a first diamond semiconductor layer 1, the second diamond semiconductor layer 2, the third diamond semiconductor layer 3, a fourth diamond semiconductor layer 4, the fifth diamond semiconductor device 5, a first electrode 6, a second electrode 7, and an insulating layer 8.

The first diamond semiconductor layer 1 has a main surface 1a at its upper surface. A plane orientation of the main surface 1a of the first diamond semiconductor layer 1 is within ±=10 degrees from a {100} plane in a <011> direction. The first diamond semiconductor layer 1 has a step at an end portion of the main surface 1a, and a side surface of the step is a slope portion 1b which is inclined relative to the main surface 1a. There is a surface 1c at the bottom portion of the step.

In addition, the first diamond semiconductor layer 1 has the surface 1c next to the slope portion 1b at a side opposite to a side of the main surface 1a in the surface direction of the main surface 1a. The surface 1c is in parallel with the main surface 1a.

The first diamond semiconductor layer 1 uses a high resistance material. The first diamond semiconductor layer 1 is an Ib substrate or the like, for example. The first diamond semiconductor layer 1 has a first conductivity type. The first conductivity type is an n-type, for example. Further, AlN, SiC, a semi-insulating substrate, an insulating substrate may be used, instead of the first diamond semiconductor layer 1.

The second diamond semiconductor layer 2 is provided on the first diamond semiconductor layer 1. The second diamond semiconductor layer 2 is provided in contact with the main surface 1a of the first diamond semiconductor layer 1. The second diamond semiconductor layer 2 has an i-type or a second conductivity type. The second conductivity type is a p-type, for example. A concentration of the i-type or the second conductivity type impurities of the second diamond semiconductor layer 2 is preferably not more than $1 \times 10^{16}$ atoms/cm$^3$. A thickness of the second diamond semiconductor layer 2 is not less than 10 µm and not more than 1000 µm, for example. A length in the direction horizontal to an upper surface of the second diamond semiconductor layer 2, that is a width thereof is not less than 10 µm and not more than 1 cm, for example.

The second diamond semiconductor layer 2 has a first side surface 2a and a second side surface 2b at one end portion thereof. The first side surface 2a is located at a side close to the first diamond semiconductor layer 1. The first side surface 2a has a slope surface of the same degree as the slope portion 1b of the first diamond semiconductor layer 1. The second side surface 2b is located more distant from the first diamond semiconductor layer 1 than the first side surface 2a in the laminating direction. The second side surface 2b exists such that a corner portion of the second diamond semiconductor layer 2 is sandwiched between it and the first side surface 2a.

In a diamond semiconductor formed by CVD (Chemical Vapor Deposition) growth, an doping efficiency of impurities into the layer thereof greatly depends on its plane orientation. For example, when an impurity is phosphorus (P) that is an n-type dopant, in the case of {111} plane growth on a {111} plane substrate, that is in the case of growth in the <111> direction, an introduction efficiency of phosphorus is about 0.02%. In contrast, in the case of {110} plane growth on a {110} plane substrate, that is in the case of growth in the <110> direction, an introduction efficiency of phosphorus is about 0.0002%. In addition, in the case of {100} plane growth on a {100} plane substrate, that is in the case of growth in the <100> direction, an introduction efficiency of phosphorus is less than 0.00001%.

For the reason, in order to grow a diamond semiconductor layer which can introduce as much phosphorus as possible, and in which a concentration of phosphorus can be controlled, a plane orientation of the first side surface 2a of the second diamond semiconductor layer 2 is made to a {111} plane, for example. A plane orientation of the second side surface 2b of the second diamond semiconductor layer 2 is preferably within <100> ±10 degrees from the {111} plane.

The third diamond semiconductor layer 3 is provided in contact with a slope surface of the first side surface 2a of the second diamond semiconductor layer 2 and a slope surface of the first slope portion 1b of the first diamond semiconductor layer 1. A thickness of the third diamond semiconductor layer 3 is not less than 0.5 µm and not more than 1 µm.

The third diamond semiconductor layer 3 has the first conductivity type. The first conductivity type is the n-type, for example. The third diamond semiconductor layer 3 is doped with phosphorus (P) as the n-type impurity. A concentration of the first conductivity type impurities of the third diamond semiconductor layer 3 has a concentration gradient, and it is preferable that the concentration of the first conductivity type impurities becomes larger in the direction from the second diamond semiconductor layer 2 side toward an opposite side of the second diamond semiconductor layer 2. This is because of properly performing profile control of the concentration of the impurities which determines the conductivity type of the third diamond semiconductor layer 3.

A concentration of the first conductivity type impurities of the third diamond semiconductor layer 3 at the second diamond semiconductor layer 2 side is not less than $1 \times 10^{18}$ atoms/cm$^3$ and not more than $1 \times 10^{19}$ atoms/cm$^3$, for example. A concentration of the first conductivity type impurities of the third diamond semiconductor layer 3 at a side opposite to the second diamond semiconductor layer 2 is not less than $1 \times 10^{19}$ atoms/cm$^3$, for example. The concentration gradient of the first conductivity type impurities of the third diamond semiconductor layer 3 is controlled so that the concentration of the first conductivity type impurities becomes larger in the direction from the second diamond semiconductor layer 2 side toward the side opposite to the second diamond semiconductor layer 2, and thereby the crystal quality of the third diamond semiconductor layer 3 is improved, and a low resistance junction can be realized between the third diamond semiconductor layer 3 and the second diamond semiconductor layer 2. The fourth diamond semiconductor layer 4 is provided in contact with a third side surface 2c of the second diamond semiconductor layer 2 at a side opposite to a side of the third diamond semiconductor layer 3, in the direction from the third diamond semiconductor layer 3 toward the second diamond semiconductor layer 2, and the main surface 1a of the first diamond semiconductor layer 1. A thickness of the fourth diamond semiconductor layer 4 is not less than 0.1 µm and not more than 1 µm. The fourth diamond semiconductor layer 4 has the second conductivity type. The second conductivity type is the p-type, for example. The fourth diamond semiconductor layer 4 is doped with boron (B) as the p-type impurity. A concentration of the second conductivity type impurities of the fourth diamond semiconductor layer 4 is not less than $1 \times 10^{19}$ atoms/cm$^3$. The concentration of the second conductivity type impurities of the fourth diamond semiconductor layer 4 is $2 \times 10^{20}$ atoms/cm$^3$.

Here, a depletion layer width of the pn junction interface between the second diamond semiconductor layer 2 and the third diamond semiconductor layer 3 is shortened, particularly at the junction end, resulting from the defect level of the surface or the interface level, and thereby the electric field strength is increased. Here, the junction end is the pn junction at an end portion 100. Consequently, the fifth diamond semiconductor layer 5 is provided in the vicinity of this junction end, and thereby the electric field strength at the junction end can be relaxed. That is, the fifth diamond semiconductor layer 5 has been arranged in the form of a JTE (Junction Termination Extension) structure. In addition, the insulating layer 8 which covers the fifth diamond semiconductor layer 5 relaxes the influence of pinning due to the surface level, as the passivation film, and contributes to the improvement of the withstand voltage of the whole PIN diode 10, along with the fifth diamond semiconductor layer 5. That is, it is preferable that the fifth diamond semiconductor layer 5 is provided in contact with the second side surface 2b in the vicinity of a corner portion 101 of the second diamond semiconductor layer 2. The fifth diamond semiconductor layer 5 has the second conductivity type. The second conductivity type is the n-type, for example. The fifth diamond semiconductor layer 5 is doped with phosphorus (P) as the n-type impurity. A concentration of the first conductivity type impurities of the fifth diamond semiconductor layer 5 is lower than the concentration of the first conductivity type impurities of the third diamond semiconductor layer 3.

The n-type fifth diamond semiconductor layer 5 with a low concentration is further provided in the vicinity of the corner portion of the second diamond semiconductor layer 2, and thereby a width of a depletion layer in the junction between the second diamond semiconductor layer 2 and the fifth diamond semiconductor layer 5 is increased, and accordingly electric field concentration to the corner portion of the second diamond semiconductor layer 2 can be relaxed. Accordingly, a further electric field relaxation effect is obtained, and thereby a withstand voltage of the junction is improved.

Depending on a voltage to be applied to the diamond semiconductor device 10, the fifth diamond semiconductor layer 5 may not be provided. The first electrode 6 is provided in a state laminated on the third diamond semiconductor layer 3. The first electrode 6 is a cathode electrode, and is formed of metal. The metal is titanium (Ti), platinum (Pt), gold (Au), for example. It is preferable that the first electrode 6 is in ohmic contact with the n-type third diamond semiconductor layer 3.

The second electrode 7 is provided in a state laminated on the fourth diamond semiconductor layer 4. The second electrode 7 is an anode electrode, and is formed of metal. The metal is titanium (Ti), platinum (Pt), gold (Au), for example. It is preferable that the second electrode 7 is in ohmic contact with the p-type fourth diamond semiconductor layer 4.

The insulating layer 8 covers a part of the surfaces of the first to fifth diamond semiconductor layers 1-5. The insulating layer 8 does not cover the first and second electrodes 6, 7, and covers a part of an interface between the first electrode 6 and the third diamond semiconductor layer 3, and a part of an interface between the second electrode 7 and the fourth diamond semiconductor layer 4. The insulating layer 8 is a film of silicon oxide such as $SiO_2$ or a silicon nitride film, for example.

When I-V characteristic of the diamond semiconductor device 10 of the present embodiment was measured, a rectification ratio at ±10 V was a value of not less than 10-digit, and a forward current density at 10 V was 10000 $A/cm^2$. In addition, a reverse leakage current at 100 V was not more than 1 pA, and a voltage up to 10 kV was applied to the diamond semiconductor device 10, breakdown was not generated.

In the present embodiment, the n-type third diamond semiconductor layer 3 having an electric field relaxation effect is provided on the side surface of the i-type or the p-type second diamond semiconductor layer 2, and thereby the withstand voltage of the junction of the second diamond semiconductor layer 2 and the third diamond semiconductor layer 3 is improved.

In addition, in the present embodiment, the side surface of the second diamond semiconductor layer 2 is provided in the specified direction, and thereby it becomes easy to make the impurity concentration of the n-type third diamond semiconductor layer 3 to a desired concentration. Accordingly, the concentration gradient can be controlled so that the impurity concentration of the n-type third diamond semiconductor layer 3 having an electric field relaxation effect for relaxing the electric field between the second diamond semiconductor layer 2 and the first electrode 6 becomes smaller at the second diamond semiconductor layer 2 side, and thereby the crystal quality of the third diamond semiconductor layer 3 can be improved, and a PIN diode having a low resistance junction can be realized.

Further, in the present embodiment, the n-type fifth diamond semiconductor layer 5 with a low concentration is provided, in the vicinity of the corner portion of the second diamond semiconductor layer 2, and thereby the width of the depletion layer in the fifth diamond semiconductor layer 5 is increased, and accordingly it is possible to relax the electric field concentration to the corner portion of the second diamond semiconductor layer 2. Accordingly, a further electric field relaxation effect is obtained, and the withstand voltage of the junction is improved.

From the viewpoint of the electric field concentration, it is preferable that the slope surface of the first side surface 2a of the second diamond semiconductor layer 2 is inclined to the upper surface of the first diamond semiconductor layer 1 by not less than 10 degrees and not more than 55 degrees.

In addition, the diamond semiconductor device 10 of the present embodiment has been a PIN diode of a horizontal type, but may have a device structure of a vertical type.

Hereinafter, a manufacturing method of the diamond semiconductor device 10 will be described.

FIGS. 2A-2F show a manufacturing process of the diamond semiconductor device 10.

Figure 2A:
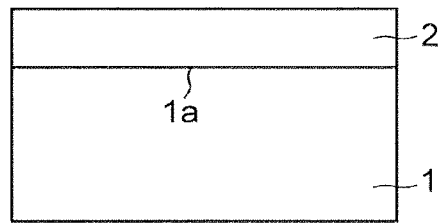
FIGS. 2A-2F are schematic sectional views showing a manufacturing method of the diamond semiconductor device of the embodiment.

In FIG. 2A, the main surface 1a of the first diamond semiconductor layer 1 has the plane orientation within ±10 degrees from the {100} plane in the <011> direction. The second diamond semiconductor layer 2 is grown and formed on the main surface 1a of the first diamond semiconductor layer 1 by a microwave plasma CVD method.

Figure 2B:
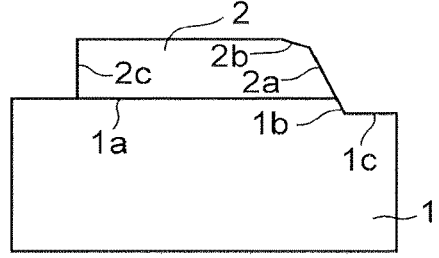

In FIG. 2B, after the growth of the second diamond semiconductor layer 2, the first side surface 2a having the plane orientation of the {111} plane is formed on the second diamond semiconductor layer 2 by etching. In addition the second side surface 2b having the plane orientation within ±10 degrees from the {111} plane is formed at the upper portion of the first side surface 2a by etching. Further, the slope portion 1b and the surface 1c are formed on the first diamond semiconductor layer 1 by etching, and the third side surface 2c is formed on the second diamond semiconductor layer 2 by etching.

Figure 2C:
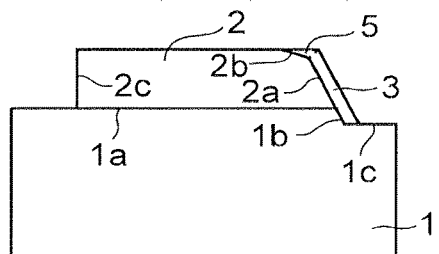

In FIG. 2C, the third diamond semiconductor layer 3 is grown and formed on the first side surface 2a and the slope portion 1b, and the fifth diamond semiconductor layer 5 is grown and formed on the second side surface 2b. The third diamond semiconductor layer and the fifth diamond semiconductor layer 5 are grown by a microwave plasma CVD method. The third diamond semiconductor layer and the fifth diamond semiconductor layer 5 are grown simultaneously by one time of growth. For the reason, a boundary between the third diamond semiconductor layer 3 and the fifth diamond semiconductor layer 5 is unclear. These layers 3, 5 are grown using phosphorus (P) as a dopant under the condition that the {111} plane grows dominantly. By this means, the third diamond semiconductor layer 3 is formed on the first side surface 2a having a plane orientation in the vicinity of the {111} plane. In addition, the fifth diamond semiconductor layer 5 having a concentration of phosphorus (P) lower than that of the third diamond semiconductor layer 3 is formed on the second side surface 2b. A concentration of phosphorus contained in the third diamond semiconductor layer 3 is $2\times10^{20}$ cm$^{-3}$, for example.

Figure 2D:
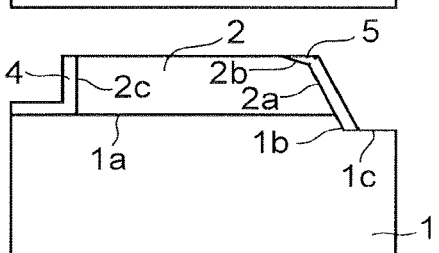

In FIG. 2D, the fourth diamond semiconductor layer 4 is formed on the third side surface 2c using born (B) as a dopant. The fourth diamond semiconductor layer 4 is grown by a microwave plasma CVD method. A concentration of boron contained in the fourth diamond semiconductor layer 4 is $2\times10^{20}$ cm$^{-3}$, for example.

Figure 2E:
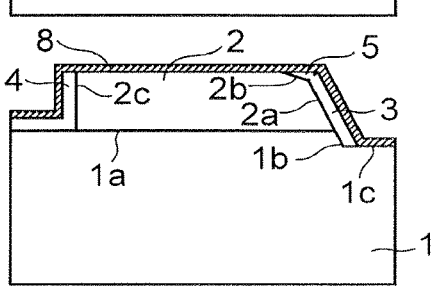

In FIG. 2E, the insulating layer 8 such as SiO$_2$ is formed on the surface 1c, the surface of the third diamond semiconductor layer 3, the surface of the fifth diamond semiconductor layer 5, the surface of the second diamond semiconductor layer 2, the surface of the fourth diamond semiconductor layer 4.

Figure 2F:
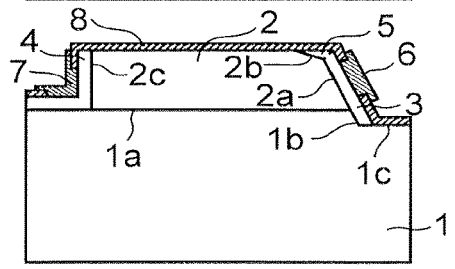

In FIG. 2F, the insulating layer 8 covering a part of the third diamond semiconductor layer 3, and the insulating layer 8 covering a part of the forth diamond semiconductor layer 4 are removed by a patterning using a photolithography, and thereby the part of the third diamond semiconductor layer 3, and the part of the forth diamond semiconductor layer 4 are exposed. The first electrode 6 and the second electrode 7 are respectively formed on the third diamond semiconductor layer 3 and the forth diamond semiconductor layer 4 which have been exposed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A diamond semiconductor device comprising:
    a first diamond semiconductor layer of a first conductivity type having a main surface;
    a second diamond semiconductor layer of an i-type or a second conductivity type provided on the main surface of the first diamond semiconductor layer, and having a first side surface with a plane orientation of a {111};
    a third diamond semiconductor layer of the first conductivity type provided on the first side surface; and
    a fourth diamond semiconductor layer of the second conductivity type provided on the main surface of the first diamond semiconductor layer and on a side surface of the second diamond semiconductor layer, at a side opposite to a side of the third diamond semiconductor layer.

2. The diamond semiconductor device according to claim 1, further comprising:
    a second side surface with a plane orientation of <100> ±10 degrees from the {111} plane of the first side surface; and
        a fifth diamond semiconductor layer of the first conductivity type provided on the second side surface.

3. The diamond semiconductor device according to claim 2 wherein:
    a concentration of the first conductivity type impurities of the fifth diamond semiconductor layer is lower than a concentration of the first conductivity type impurities of the third diamond semiconductor layer.

4. The diamond semiconductor device according to claim 1 wherein:
    a plane orientation of the main surface in the first diamond semiconductor layer is within ±10 degrees in a <011> direction from a {100} plane.

5. The diamond semiconductor device according to claim 1 wherein:
    a concentration of the first conductivity type impurities of the third diamond semiconductor layer at the second diamond semiconductor layer side is not less than $1\times10^{18}$ atoms/cm$^3$ and not more than $1\times10^{19}$ atoms/cm$^3$; and
    a concentration of the first conductivity type impurities of the third diamond semiconductor layer at a side opposite to the second diamond semiconductor layer is not less than $1\times10^{19}$ atoms/cm$^3$.

6. The diamond semiconductor device according to claim 1 wherein:
    a concentration of the second conductivity type impurities of the fourth diamond semiconductor layer is not less than $1\times10^{19}$ atoms/cm$^3$.

7. The diamond semiconductor device according to claim 1 wherein:
    a concentration of the i-type or the second conductivity type impurities of the second diamond semiconductor layer is not more than $1\times10^{16}$ atoms/cm$^3$.

8. The diamond semiconductor device according to claim 1 wherein:
    the first conductivity type is an n-type and the second conductivity type is a p-type.

9. The diamond semiconductor device according to claim 1 further comprising:
    a first electrode provided on the third diamond semiconductor layer; and
    a second electrode provided on the fourth diamond semiconductor layer.

10. The diamond semiconductor device according to claim 1 wherein:
    a thickness of each of the third diamond semiconductor layer and the fourth diamond semiconductor layer is not less than 0.5 μm and not more than 1 μm.

11. The diamond semiconductor device according to claim 1 wherein:
    a thickness of the second diamond semiconductor layer is not less than 10 μm.

12. The diamond semiconductor device according to claim 1 wherein:
    a thickness of the first diamond semiconductor layer is not less than 50 μm and not more than 100 μm.

13. A diamond semiconductor device comprising:
    a first diamond semiconductor layer of an n-type having a main surface;
    a second diamond semiconductor layer of an i-type or a second conductivity type being provided on the main surface of the first diamond semiconductor layer, and having a first side surface with a plane orientation of a {111};
    a third diamond semiconductor layer of the n-type provided on the first side surface; and
    a fourth diamond semiconductor layer of a p-type provided on the main surface of the first diamond semiconductor layer and on a side surface of the second diamond semiconductor layer, at a side opposite to a side of the third diamond semiconductor layer.

14. The diamond semiconductor device according to claim 13 further comprising:
   a second side surface with a plane orientation of <100> ±10 degrees from the {111} plane of the first side surface; and,
   a fifth diamond semiconductor layer of the n-type provided on the second side surface.

15. The diamond semiconductor device according to claim 14 wherein:
   a concentration of the n-type impurities of the fifth diamond semiconductor layer is lower than a concentration of the n-type impurities of the third diamond semiconductor layer.

16. The diamond semiconductor device according to claim 13 wherein:
   a plane orientation of the main surface in the first diamond semiconductor layer is within ±10 degrees in a <011> direction from a {100} plane.

17. A diamond semiconductor device comprising:
   a first diamond semiconductor layer of a first conductivity type having a main surface;
   a second diamond semiconductor layer of an i-type or a second conductivity type being provided on the main surface of the first diamond semiconductor layer, and having a first side surface with a plane orientation of a {111};
   a third diamond semiconductor layer of the first conductivity type having an electric field relaxation effect provided on the first side surface; and
   a fourth diamond semiconductor layer of the second conductivity type provided on the main surface of the first diamond semiconductor layer and on a side surface of the second diamond semiconductor layer, at a side opposite to a side of the third diamond semiconductor layer.

18. The diamond semiconductor device according to claim 17 further comprising:
   a second side surface with a plane orientation of <100> ±10 degrees from the {111} plane of the first side surface; and
   a fifth diamond semiconductor layer of the first conductivity type relaxing electric field concentration to a corner portion of the second diamond semiconductor layer, provided on the second side surface.

19. The diamond semiconductor device according to claim 18 wherein:
   a concentration of the first conductivity type impurities of the fifth diamond semiconductor layer is lower than a concentration of the first conductivity type impurities of the third diamond semiconductor layer.

20. The diamond semiconductor device according to claim 17 wherein:
   a plane orientation of the main surface in the first diamond semiconductor layer is within ±10 degrees in a <011> direction from a {100} plane.

* * * * *